United States Patent
Liu et al.

(10) Patent No.: US 12,027,345 B2
(45) Date of Patent: Jul. 2, 2024

(54) ETCHING UNIFORMITY REGULATING DEVICE AND METHOD

(71) Applicant: JIANGSU LEUVEN INSTRUMENTS CO. LTD, Xuzhou (CN)

(72) Inventors: Xiaobo Liu, Xuzhou (CN); Xuedong Li, Xuzhou (CN); Yong Qiu, Xuzhou (CN); Na Li, Xuzhou (CN); Yonggang Hou, Xuzhou (CN); Dongdong Hu, Xuzhou (CN); Lu Chen, Xuzhou (CN); Kaidong Xu, Xuzhou (CN)

(73) Assignee: JIANGSU LEUVEN INSTRUMENTS CO. LTD, Xuzhou (CN)

( * ) Notice: Subject to any disclaimer, the term of this patent is extended or adjusted under 35 U.S.C. 154(b) by 554 days.

(21) Appl. No.: 17/294,469

(22) PCT Filed: Sep. 18, 2019

(86) PCT No.: PCT/CN2019/106355
§ 371 (c)(1),
(2) Date: May 17, 2021

(87) PCT Pub. No.: WO2020/103549
PCT Pub. Date: May 28, 2020

(65) Prior Publication Data
US 2022/0013331 A1 Jan. 13, 2022

(30) Foreign Application Priority Data
Nov. 20, 2018 (CN) .......................... 201811386073.3

(51) Int. Cl.
*H01J 37/32* (2006.01)
*H01L 21/66* (2006.01)

(52) U.S. Cl.
CPC ........ *H01J 37/32183* (2013.01); *H01L 22/26* (2013.01); *H01J 37/32642* (2013.01);
(Continued)

(58) Field of Classification Search
CPC .......... H01J 37/32183; H01J 37/32642; H01J 2237/2007; H01J 2237/3343; H01J 37/24;
(Continued)

(56) References Cited

U.S. PATENT DOCUMENTS

| 2008/0197780 A1* | 8/2008 | Yamazawa ........ H01L 21/67069 315/111.21 |
| 2009/0230089 A1* | 9/2009 | Bera ................. H01J 37/32174 204/164 |

(Continued)

FOREIGN PATENT DOCUMENTS

| CN | 1619767 A * 5/2005 ........ H01J 37/32091 |
| CN | 101047114 A 10/2007 |

(Continued)

OTHER PUBLICATIONS

International Search Report issued in corresponding International Application No. PCT/CN2019/106355; mailed Dec. 29, 2019; China National Intellectual Administration, Beijing, China, 8 pgs.

(Continued)

*Primary Examiner* — Jeffrie R Lund
(74) *Attorney, Agent, or Firm* — HAUPTMAN HAM, LLP

(57) ABSTRACT

An etching uniformity regulating device and method. The device comprises an inductor and a capacitor connected in parallel. One end of the etching uniformity regulating device is connected to a built-in ring located at the edge of an electrostatic chuck of an etching machine, and the other end is grounded. The purpose of controlling the edge electric field is achieved by regulating a capacitance of the capacitor, so as to regulate the etching rate of the edge, thereby achieving etching uniformity.

7 Claims, 2 Drawing Sheets

(52) U.S. Cl.
CPC .................. *H01J 2237/2007* (2013.01); *H01J 2237/3343* (2013.01)

(58) Field of Classification Search
CPC .... H01J 37/305; H01J 37/32; H01J 37/32155; H01J 37/3053; H01J 37/32385; H01J 37/32174; H01J 37/32532; H01J 2237/3341; H01L 22/26; H01L 21/67069
See application file for complete search history.

(56) References Cited

U.S. PATENT DOCUMENTS

| | | | |
|---|---|---|---|
| 2015/0014276 A1 | 1/2015 | Yamazawa | |
| 2018/0102238 A1* | 4/2018 | Gu | ................... H01J 37/32174 |
| 2020/0234924 A1* | 7/2020 | Yokogawa | ............ H01J 37/321 |
| 2022/0013331 A1* | 1/2022 | Liu | ................... H01J 37/32183 |
| 2022/0208525 A1* | 6/2022 | Arakelyan | ........ H01J 37/32458 |

FOREIGN PATENT DOCUMENTS

| | | | | |
|---|---|---|---|---|
| CN | 100380605 C | * | 4/2008 | ........ H01J 37/32027 |
| CN | 101971713 A | | 2/2011 | |
| CN | 102804930 A | | 11/2012 | |
| CN | 107919263 A | | 4/2018 | |
| KR | 101909479 B1 | | 10/2018 | |

OTHER PUBLICATIONS

Written Opinion issued in corresponding International Application No. PCT/CN2019/106355; mailed Dec. 23, 2019; China National Intellectual Administration, Beijing, China, 5 pgs.

\* cited by examiner

ETCHING UNIFORMITY REGULATING DEVICE AND METHOD

RELATED APPLICATIONS

The present application is a U.S. National Phase of International Application Number PCT/CN2019/106355 filed Sep. 18, 2019 and claims priority to Chinese Application Number 201811386073.3 filed Nov. 20, 2018.

BACKGROUND OF THE INVENTION

Field of the Invention

The present invention relates to the field of semiconductor technologies, and in particular, to an etching uniformity regulating device and method.

Description of Related Art

A focusing ring and a built-in ring are disposed around an electrostatic chuck of a conventional etching machine, so that an electric field at the edge of a wafer is perpendicular to a horizontal direction of the wafer, and the etching rates and directions are identical at the edge and the center of the wafer. However, with the accumulation of plasma etching time, the focusing ring at the edge of the electrostatic chuck may also be eroded by the plasma, resulting in a thickness reduction of the focusing ring and causing a tilt in the electric field direction of a sheath layer. Consequently, the etching rate and direction at the edge of the wafer are changed.

Likewise, the arrangement of the focusing ring and the built-in ring around the electrostatic chuck can only match specific plasma conditions. When the etching machine needs to run multiple processes, the uniformity requirement of the processes at the wafer edge usually cannot be met or it is required to use a different focusing ring and built-in ring for replacement to improve the uniformity at the edge.

SUMMARY OF THE INVENTION

To solve the foregoing problem, the present invention discloses an etching uniformity regulating device, which includes an inductor and a capacitor connected in parallel. One end of the etching uniformity regulating device is connected to a built-in ring located at the edge of an electrostatic chuck of an etching machine, and the other end is grounded.

In the etching uniformity regulating device of the present invention, preferably, the inductor is an air-core or magnetic-core inductor, and a self-resonance frequency (SRF) of the inductor is greater than the frequency of a lower electrode radio-frequency power supply of the etching machine.

In the etching uniformity regulating device of the present invention, preferably, the capacitor is an adjustable or motor capacitor.

In the etching uniformity regulating device of the present invention, preferably, the SRF of the inductor is not more than 2 times the frequency of the lower electrode radio-frequency power supply.

In the etching uniformity regulating device of the present invention, preferably, the SRF of the capacitor is more than 5 times the frequency of the lower electrode radio-frequency power supply.

The present invention further discloses an etching uniformity regulating method, which includes the following steps: determining whether a resonance frequency of the etching uniformity regulating device is equal to the frequency of a lower electrode radio-frequency power supply of an etching machine; and when a determining result is no, regulating a capacitance of the capacitor of the etching uniformity regulating device, so that the resonance frequency of the etching uniformity regulating device approaches the frequency of the lower electrode radio-frequency power supply of the etching machine, thus rendering the etching rates at the edge and the center of a wafer consistent.

In the etching uniformity regulating method of the present invention, preferably, when the resonance frequency of the etching uniformity regulating device is less than the frequency of the lower electrode radio-frequency power supply, the capacitance of the capacitor of the etching uniformity regulating device is increased, so that the etching rate at the edge of the wafer is gradually reduced.

In the etching uniformity regulating method of the present invention, preferably, when the resonance frequency of the etching uniformity regulating device is greater than the frequency of the lower electrode radio-frequency power supply, the capacitance of the capacitor of the etching uniformity regulating device is decreased, so that the etching rate at the edge of the wafer is gradually increased.

The present invention achieves the purpose of controlling the edge electric field by controlling a capacitance of the capacitor, so as to regulate the etching rate at the edge, thereby achieving etching uniformity.

DETAILED DESCRIPTION OF THE INVENTION

To make the objective, technical solutions, and advantages of the present invention clearer, the technical solutions in the embodiments of the present invention are clearly and completely described below with reference to the accompanying drawings in the embodiments of the present invention. It should be noted that, the specific embodiments described herein are merely used for explaining the present invention, rather than limiting the present invention. The described embodiments are some rather than all of the embodiments of the present invention. Based on the described embodiments of the present invention, other embodiments acquired by those of ordinary skill in the art without creative effort all belong to the protection scope of the present invention.

In the description of the present invention, it should be noted that, the orientation or positional relationship indicated by the terms "upper", "lower", "vertical", "horizontal", etc. are based on the orientation or positional relationship shown in the accompanying drawings, and are only used for the convenience of describing the present invention and simplifying the description, rather than indicating or implying that the denoted device or element must have a specific orientation or be constructed and operated in a specific orientation. Therefore, these terms cannot be construed as limitations to the present invention. In addition, the terms "first" and "second" are merely used for description, but are not construed as indication or implying relative importance.

In addition, many specific details of the present invention, such as the structure, material, dimensions, and treatment process and technique of the device, are described below for a clearer understanding of the present invention. However, as those skilled in the art can understand, the present invention may not be implemented according to these specific details. Unless otherwise indicated below, various parts of the device may be made of materials known to those skilled in the art or materials with similar functions developed in the future.

Figure 1:
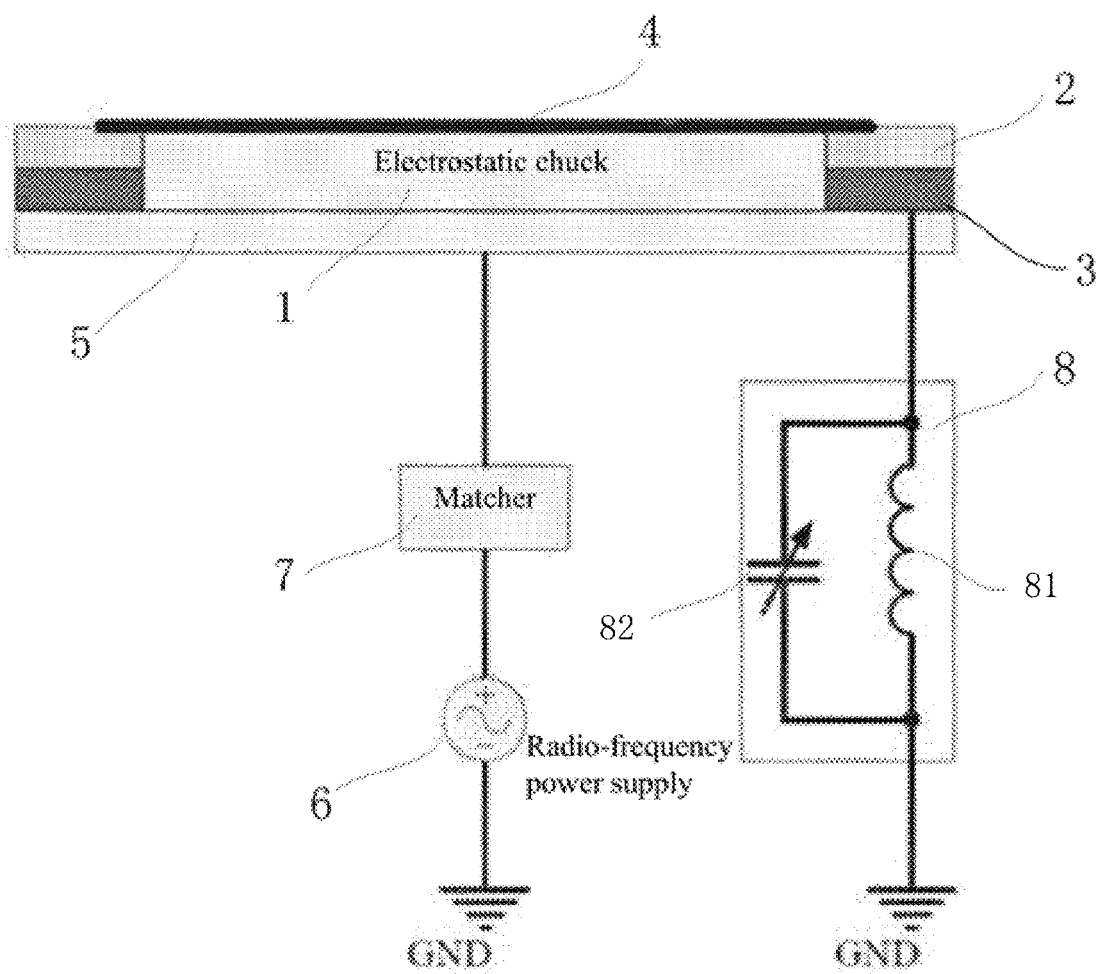
FIG. 1 is a schematic installation diagram of an etching uniformity regulating device of the present invention.

FIG. 1 is a schematic installation diagram of an etching uniformity regulating device of the present invention. As shown in FIG. 1, a focusing ring 2 and a built-in ring 3 are disposed at the edge of an electrostatic chuck 1 of an electrostatic etching machine. The built-in ring or a lower surface of the built-in ring is a conductive material. A wafer 4 to be etched is placed above the electrostatic chuck 1, and an adapter panel 5 is disposed below the electrostatic chuck. A lower electrode radio-frequency power supply 6 is connected to the adapter panel 5 via a matcher 7. The etching uniformity regulating device 8 includes an inductor 81 and a capacitor 82 connected in parallel, where the inductor 81 is an air-core or magnetic-core inductor and the capacitor 82 is an adjustable or motor capacitor. One end of the etching uniformity regulating device 8 is connected to the built-in ring 3 and the other end is grounded. Values of the inductor 81 and the capacitor 82 are selected according to the frequency of the lower electrode radio-frequency power supply 6. An SRF of the inductor 81 is greater than the frequency of the lower electrode radio-frequency power supply 6, and further preferably, the SRF of the inductor 81 is not more than 2 times the frequency of the lower electrode radio-frequency power supply 6. The SRF of the capacitor 82 is more than 5 times the frequency of the lower electrode radio-frequency power supply 6.

An operating principle of the etching uniformity regulating device of the present invention is described in detail below. In plasma, a gap between the built-in ring and the plasma may be equated to a toroidal plate capacitor, a gap between the built-in ring and a machine housing may also be equated to a cylindrical capacitor. These two distributed capacitors are in parallel connection and together form a dielectric capacitor for transmission of radio-frequency energy with the plasma.

When the resonance frequency of the etching uniformity regulating device is lower than the frequency of the lower electrode radio-frequency power supply, the etching uniformity regulating device is electrically inductive. The etching uniformity regulating device and the parallel structure of the foregoing distributed capacitors cause a reduction in the dielectric capacitance of an equivalent radio-frequency circuit. In order to achieve matched power transmission, an adjustable series capacitance in a radio-frequency matcher is increased to compensate for the capacitance reduction in a load circuit. In a capacitor series circuit, the voltage distribution is inversely proportional to the magnitude of the capacitance. Therefore, an increase in the voltage between the built-in ring and the plasma results in an acceleration in the etching rate at the edge. In this case, by increasing the capacitance of the parallel capacitors, the resonance frequency of the etching uniformity regulating device approaches the frequency of the lower electrode radio-frequency power supply. Then, the impedance of the etching uniformity regulating device increases, its influence on the impedance of the radio-frequency circuit decreases, and the etching rate at the edge is reduced.

When the resonance frequency of the etching uniformity regulating device exceeds the frequency of the lower electrode radio-frequency power supply, the etching uniformity regulating device is electrically capacitive. The etching uniformity regulating device and the parallel structure of the foregoing distributed capacitors cause an increase in the dielectric capacitance of the equivalent radio-frequency circuit. In order to achieve matched power transmission, the adjustable series capacitance in the radio-frequency matcher is reduced to compensate for the capacitance increase in the load circuit. In a capacitor series circuit, the voltage distribution is inversely proportional to the magnitude of the capacitance. Therefore, a decrease in the voltage between the built-in ring and the plasma results in a deceleration in the etching rate at the edge. In this case, by decreasing the capacitance of the parallel capacitors, the resonance frequency of the etching uniformity regulating device approaches the frequency of the lower electrode radio-frequency power supply. Then, the impedance of the etching uniformity regulating device increases, its influence on the impedance of the radio-frequency circuit increases, and the etching rate at the edge is raised. Thus, regulation of the resonance frequency of the uniformity regulating device can be realized by regulating the capacitance of the capacitor in the etching uniformity regulating device, so that the etching rates at the edge and the center become consistent.

In this way, the purpose of controlling the edge electric field is achieved by controlling the capacitance of the parallel capacitors. Moreover, different capacitances are set for different process conditions, ensuring consistent etching rates at the edge and the center of the wafer. In a specific application, as the focusing ring becomes thinner by etching, part of an edge solid dielectric which serves as a radio-frequency transmission medium is replaced by vacuum, resulting in a reduction in the etching rate. The etching rate at the edge can be compensated by decreasing the capacitance of an adjustable capacitor, to increase the etching rate at the edge, thus ensuring that the etching rate at the edge of the wafer is consistent with that at the center.

Figure 2:
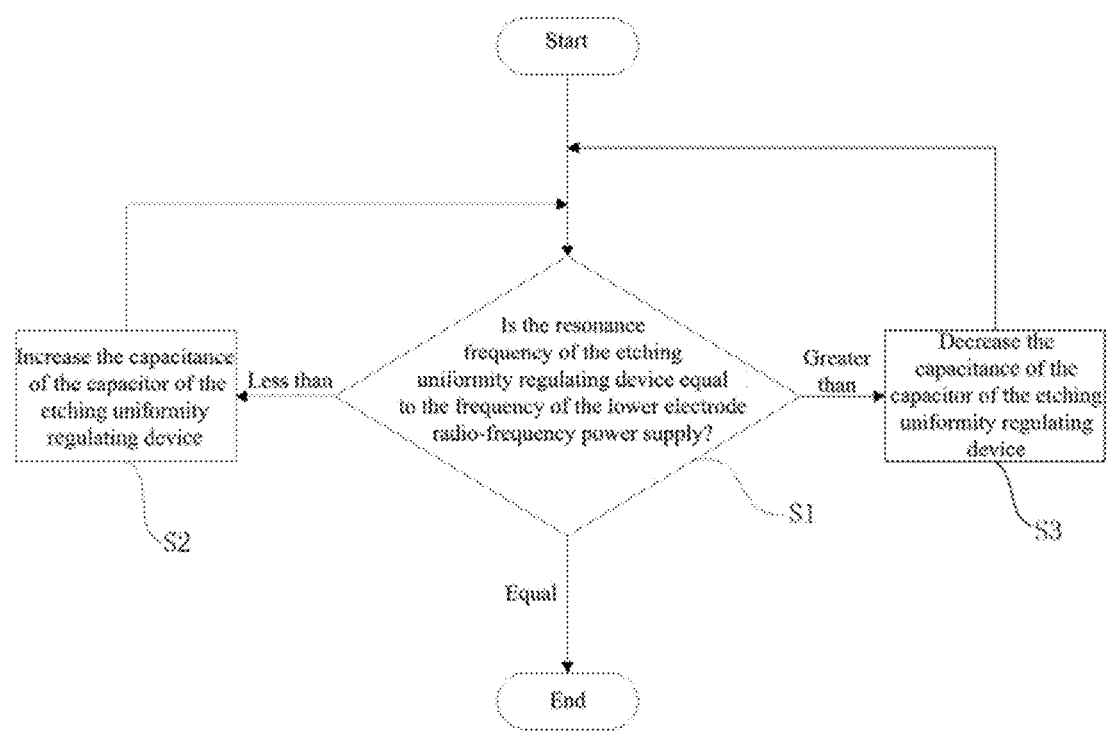
FIG. 2 is a flowchart of an etching uniformity regulating method of the present invention.

During regulation of etching uniformity by using the etching uniformity regulating device of the present invention, as shown in FIG. 2, first, in step S1, a resonance frequency of the etching uniformity regulating device is compared with a frequency of the lower electrode radio-frequency power supply. When a comparison result shows that the resonance frequency of the etching uniformity regulating device is less than the frequency of the lower electrode radio-frequency power supply, the process goes to step S2: increasing the capacitance of the capacitor of the etching uniformity regulating device and then performing step S1 again for comparison. This procedure is repeated for many times till the resonance frequency of the etching uniformity regulating device is equal to the frequency of the lower electrode radio-frequency power supply. When the comparison result shows that the resonance frequency of the etching uniformity regulating device is greater than the frequency of the lower electrode radio-frequency power supply, the process goes to step S3: decreasing the capacitance of the capacitor of the etching uniformity regulating device and then performing step S1 again for comparison. This procedure is repeated for many times till the resonance frequency of the etching uniformity regulating device is equal to the frequency of the lower electrode radio-frequency power supply.

The above merely describes a specific embodiment of the present invention, but the protection scope of the present invention is not limited thereto. Changes or replacements easily conceived by any person skilled in the art within the technical scope of the present invention all fall within the protection scope of the present invention.

What is claimed is:

1. An etching regulating method, which uses an etching regulating device comprising an inductor and a capacitor connected in parallel, wherein one end of the etching regulating device is connected to a built-in ring located at the edge of an electrostatic chuck of an etching machine and another end is grounded, wherein the method comprises following steps:

determining whether a resonance frequency of the etching regulating device is equal to the frequency of a lower electrode radio-frequency power supply of an etching machine; and when a determining result is no, regulating a capacitance of the capacitor of the etching regulating device, so that the resonance frequency of the etching regulating device approaches the frequency of the lower electrode radio-frequency power supply of the etching machine, thus rendering an etching rate at the edge of a wafer and the etching rate at the center of the wafer consistent.

2. The etching regulating method according to claim 1, wherein when the resonance frequency of the etching uniformity regulating device is less than the frequency of the lower electrode radio-frequency power supply, the capacitance of the capacitor of the etching regulating device is increased, so that the etching rate at the edge of the wafer is gradually reduced.

3. The etching uniformity regulating method according to claim 1, wherein when the resonance frequency of the etching regulating device is greater than the frequency of the lower electrode radio-frequency power supply, the capacitance of the capacitor of the etching regulating device is decreased, so that the etching rate at the edge of the wafer is gradually increased.

4. The etching regulating method according to claim 1, wherein the inductor is an air-core or magnetic-core inductor, and a self-resonance frequency (SRF) of the inductor is greater than a frequency of a lower electrode radio-frequency power supply of the etching machine.

5. The etching regulating method according to claim 4, wherein the SRF of the inductor is not more than 2 times the frequency of the lower electrode radio-frequency power supply.

6. The etching regulating method according to claim 4, wherein the SRF of the capacitor is more than 5 times the frequency of the lower electrode radio-frequency power supply.

7. The etching regulating method according to claim 1, wherein the capacitor is an adjustable or motor capacitor.

* * * * *